(12) United States Patent
Gangopadhyay et al.

(10) Patent No.: US 8,066,831 B2
(45) Date of Patent: Nov. 29, 2011

(54) SHOCK WAVE AND POWER GENERATION USING ON-CHIP NANOENERGETIC MATERIAL

(75) Inventors: Shubhra Gangopadhyay, Columbia, MO (US); Steven Apperson, Columbia, MO (US); Keshab Gangopadhyay, Columbia, MO (US); Andrey Bezmelnitsyn, Columbia, MO (US); Rajagopalan Thiruvengadathan, Columbia, MO (US); Michael Kraus, Columbia, MO (US); Rajesh Shende, Rapid City, SD (US); Maruf Hossain, Columbia, MO (US); Senthil Subramanian, Poway, CA (US); Shantanu Bhattacharya, Columbia, MO (US); Yuangang Gao, Boulder, CO (US)

(73) Assignee: The Curators of the University of Missouri, Columbia, MO (US)

( * ) Notice: Subject to any disclaimer, the term of this patent is extended or adjusted under 35 U.S.C. 154(b) by 518 days.

(21) Appl. No.: 12/083,985

(22) PCT Filed: Oct. 27, 2006

(86) PCT No.: PCT/US2006/042279
§ 371 (c)(1),
(2), (4) Date: Dec. 17, 2008

(87) PCT Pub. No.: WO2007/053543
PCT Pub. Date: May 10, 2007

(65) Prior Publication Data
US 2009/0152873 A1 Jun. 18, 2009

Related U.S. Application Data

(60) Provisional application No. 60/731,162, filed on Oct. 28, 2005.

(51) Int. Cl.
| | |
|---|---|
| C06B 45/00 | (2006.01) |
| C06B 45/18 | (2006.01) |
| C06B 33/00 | (2006.01) |
| C06B 27/00 | (2006.01) |
| D03D 23/00 | (2006.01) |
| D03D 43/00 | (2006.01) |

(52) U.S. Cl. ........... 149/3; 149/2; 149/37; 149/87; 149/109.2; 149/109.4

(58) Field of Classification Search ............ 149/3, 2, 149/379, 87, 109.29, 109.4
See application file for complete search history.

(56) References Cited

U.S. PATENT DOCUMENTS 3,732,129 A * 5/1973 Martin .................. 149/2

(Continued)

OTHER PUBLICATIONS

Rama Venkatasubramanian, Edward Siivola, Thomas Colpitts & Brooks O'Quinn "Thin-film thermoelectric devices with high room-temperature Figures of merit" Nature vol. 413, 2001, 597.

(Continued)

*Primary Examiner* — James McDonough
(74) *Attorney, Agent, or Firm* — Greer, Burns & Crain Ltd.

(57) ABSTRACT

A method of generating power uses a nanoenergetic material. The nanoenergetic material comprising thermite is obtained and deposited on a substrate. An igniter is placed on the nanoenergetic material. When power is desired, the nanoenergetic material is ignited. A transducer receives thermal, sonic, magnetic, optic and/or mechanical energy from combustion of the nanoenergetic material and converts it into electrical energy. Preferably, the transducer is a thermoelectric, piezoelectric or magneto device. Preferably, multiple transducers are integrated in one power generators to maximize the power from nanoenergetic thermites.

20 Claims, 4 Drawing Sheets

U.S. PATENT DOCUMENTS

| | | | |
|---|---|---|---|
| 6,517,802 | B1 | 2/2003 | Xiao et al. |
| 6,712,917 | B2* | 3/2004 | Gash et al. ............... 149/19.92 |
| 6,733,828 | B2 | 5/2004 | Chao et al. |
| 6,740,403 | B2 | 5/2004 | Gogotsi et al. |
| 6,818,081 | B2* | 11/2004 | Gash et al. ............... 149/19.92 |
| 6,818,344 | B2* | 11/2004 | Daoud ......................... 429/112 |
| 6,986,819 | B2* | 1/2006 | Tillotson et al. ........... 149/109.6 |
| 7,025,840 | B1* | 4/2006 | Adams ...................... 149/108.2 |
| 2003/0194602 | A1* | 10/2003 | Daoud ......................... 429/112 |
| 2004/0056458 | A1 | 3/2004 | Daoud |
| 2005/0189053 | A1* | 9/2005 | Pile et al. .................. 149/108.6 |

OTHER PUBLICATIONS

C. Greaves, "The direct conversion of heat into electricity Thermoelectric conversion and thermionic conversion" Physics Education, 1968, vol. 3 Printed in Great Britain, 330.

P.L. Hagelstein, Y. Kucherov, "Enhancement of Thermal to Electrical Energy Conversion with Thermal Diodes", Mat Res. Soc. Symp. Proc. vol. 691, 2002 Materials Research Society. G8.37.1.

P.L. Hagelstein, Y. Kucherov, "Enhanced Figure of Merit in Thermal to Electrical Energy Conversion using Diode Structures", Appl. Phys. Lett. vol. 81, 2002, 559. http://web.mit.edu/newsoffice/2001/electricitydevice.html.

Gavens, A.J., Heerden, D.V., Mann A.B., Reiss, M.E., Weihs, T.P., "Effect of intermixing on self propagating exothermic reactions in Al/Ni nanolaminate foils", Journal of Applied physics, 87(3) (2000) 1255-63.

Trot, W.M., Ericson, K.L., Ultra highspeed studies of shock phenomenon in a miniaturized system—A preliminary evaluation, Sandia National Laboratories, Albuquerque, New Mexico 87185. Technical Discussion in website http://www.risi-usa.com.

Deeds, M., Sandborn P., Swaminathan R., "Packaging of MEMS based safety and arming device", IEEE Proceedings of the intersociety conference on thermal phenomena, 2000, pp. 107-112.

Paul Redner, Steven Nicolich, Shybhra Gangopadhyay and Rajesh Shende, "The Development of Energetic Nanocomposites for the Warfighter", Particle Technology Forum, The 2005 Annual Meeting (Cincinnati, OH), Nov. 3, 2005.

Takayama, K., Saito, T. "Shock Wave/Geophysical and Medical Applications", Annual Review of Fluid Mechanics, 36 (2004) 347-49.

Baer, M.R., Kipp, M.E. and Swov, F.V., "Micromechanical modeling of heterogeneous materials", Sandia National Laboratories, Albuquerque, New Mexico 87185.

Stewart D.S., "Miniaturization of explosive technology and microdetonics", XXIICTAM, Aug. 15-21, 2004, Warsaw, Poland.

Bowden, F.P. and Yoffe, A.D., "Initiation and growth of explosions in liquids and solids", Cambridge University press, Cambridge, 1952.

Sheffield, S.A., Gustaven, R.L., Alcon, R.R., Graham, R.A. and Anderson, M.U., "Particle velocity and stress measurements in low density HMX," High pressure Science and Technology (1994) 1377-80.

Stephen D. Senturia, "Microsystem Design", Kluwer Academic Publishers, Boston/Dordrecht /London.

H.M. Mott-Smith, Irving Langmuir, "The theory of collectors in gaseous discharges", Physical Review, Oct. 1926, V. 28, 727-763.

Kaili Zhang, Chou, S.K.; Ang, S.S., "MEMS-based solid propellant microthruster design, simulation, fabrication, and testing", Journal of Microelectromechanical Systems, vol. 13, Issue: 2, Apr. 2004, pp. 165-175.

Lewis, D.H., Jr.; Janson, S.W.; Cohen, R.B.; Antonsson, EK, "Digital MicroPropulsion", The Aerospace Corporation, California Institute of Technology, pp. 517-522.

A.G. Merzhanov, "The Chemistry of Self-Propagating High Temperature Synthesis," J. Mater. Chem. 14 (2004) 1779-1786.

Merzhanov, A.G. 1990. Combustion and Plasma Synthesis of High Temperature Materials, edited by Munir, Z.A. and Holt, J.B. New York:VCH.

Munir, Z.A. and Anselmi-Tamburini "Self-Propagating Exothermic Reactions: The Synthesis of High-Temperature Materials by Compustion" (1989) 277-365.

Moore, J.J. and Feng H.J. "Combustion Synthesis of Advanced Materials: Part I. Reaction Paramters" Prog. Mater. Sci. 39 (1995) 243-273.

Moore, J.J. and Feng H.J. "Exothermic Reaction Synthesis", 295-311. Syntheis/Processing of Lightweight Metallic Materials Edited by F.H. Froes, C. Suryanarayana, and C.M. Ward—Close the Minerals, Metals & Materials Society, 1995.

S.A. Davis, S.L. Burkkett, N.H. Mendeison and S. Mann, "Bacterial templating of ordered macrostructures in silica and silica-surfactant mesophases", Nature, 1997, 385, 420-423.

H.-P. Lin, S. Cheng and C.-Y. Mou, "Mesoporous Molecular Sieves MCM-41 with a Hollow Tubular Morphology", 10, 1998, 581-589.

X. Yang, S. Chen, S. Zhao, D. Li, and H. Houyma. "Synthesis of copper nanorods using electrochemical methods" J Serb. Chem. Soc. 68 (11) (2003) 843-847.

Y.Y. Fu, R.M. Wang, J. Xu, J. Chen, Y. Yan, A.V. Narlikar, H. Zhang, "Synthesis of Large Arrays of Aligned $\alpha$-$Fe_2O_3$ Nanowires", Chemical Physics Letters 379 (2003) 373-379.

Xiao; Tongsan, D.Strutt; Peter R, Kear; Bernard H., Chen; Huimin, Wang; Donald M., Methods of synthesis for nanostructured oxides and hydroxides, U.S. Patent No. 6,517,802.

Serhiy Malynych, Igor Luzinov, and George Chumanov, "Poly(Vinyl Pyridine) as a universal surface modifier for immobilization of nanoparticles" J. Phys. Chem. B 2002 106, 1280-1285.

Newkome, G.R.; Woosley, B.D.; He, E,; Moorefield, C.D.; Guter, R.; Baker, G.R.; Escamilla, G.H.; Merrill, J. ; Luftmann, H. "Supramolecular chemistry of flexible, dendritic-based structures employing molecular recognition" Chem. Commun. 1996, 2737-2738.

Newkome, G.R.; He, E.; Moorefield, C.N., "Suprasupermolecules with Novel Properties:Metallodendrimers" Chem. Rev. 99 (1999) 1689-1746.

Narayan K. Raman, Mark T. Anderson, and C. Jeffrey Brinker, "Template-Based Approaches to the Preparation of Amorphous, Nanoporous Silicas" Chem. Mater. 8 (1996) 1682-1701.

T. Kang, Y. Park, K. Choi, J.S. Lee, and J. Yi, "Ordered mesoporous silica (SBA-15) dramatized with imidazole-containing functionalities as a selective absorbent of precious metal ions", J. Mater. Chem., 14 (2004) 1043-49.

* cited by examiner

SHOCK WAVE AND POWER GENERATION USING ON-CHIP NANOENERGETIC MATERIAL

CROSS REFERENCE TO RELATED APPLICATION

This application claims the benefit of U.S. Provisional Application 60/731,162, filed Oct. 28, 2005.

STATEMENT OF GOVERNMENT INTEREST

This invention was made with Government assistance under ARMY DAAE 30-02-C-1132 awarded by the ARMY. The Government has certain rights in this invention.

TECHNICAL FIELD

This invention deals with the power generation by the self-propagation of energetic materials. More specifically, it deals with the generation of power on a microchip that is converted to electrical energy.

BACKGROUND ART

Portable devices are very popular in our society. Common use of such devices demands the availability of portable source with which to power them. The variety of devices also demands that the power be accurately controlled. Even devices that are not portable benefit from the generation of power in a highly controlled manner. The power generators are operated while connected to an electrical storage unit such as a battery or a capacitor. Upon actuation, generated electrical pulses are delivered to a storage device. The storage device is then used as power source for another device.

Research for non-conventional sources of energy is gaining paramount importance owing to the disappearing natural resources and an increased concern for environmental safety. Over the last decade, there has been a renewed interest in "direct conversion" of heat into electricity with the discovery of new materials and structures with enhanced thermionic or thermoelectric properties. Thermionic conversion depends on the production of a current due to the flow of electrons emitted from a hot cathode. In thermoelectric conversion, a potential is developed across the material when the two ends of the material are kept at two different temperatures. Such conversions are attractive as they involve no moving parts and release no harmful byproducts to the environment. A semiconductor based "Thermal Diode", which consists of a thin thermionic emitter layer on the hot side of a thick near intrinsic semiconductor thermoelectric. Such a device has been reported to show a significant increase in the conversion efficiency as it combines the conversion due to thermionic emission as well as thermoelectric effects. Further enhancement in the conversion efficiency has been reported by blocking the reverse ohmic current by placing a hindering layer at the collector side of the thermal diode. One problem with this design is the eventual disposal of the device. While the conversion itself does not produce any byproducts, the materials used for the device, such as HgCdTe and InSb, are toxic in nature. Also, conventional microfabrication techniques cannot be applied to fabricate such a device.

Explosives are known to produce power, but their use is associated with uncontrolled generation of thermal and mechanical forces. Such forces are difficult to harness to power electrical devices. In the past few years, several studies were performed on investigating the power generation ability of piezoelectric materials. In order to produce electrical power from vibrations, thick-film piezoelectric technologies were used and maximum power output of about 2 mW was obtained under a resonant frequency. It is calculated that the power generated from a 1 cm2 piezoelectric plate can supply microwatt to milliwatt of power for in vivo bio Microelectro Mechanical Systems (MEMS) applications. The power generated from two types of circular diaphragm structures by varying the thickness ratio was also compared. Recently, three dimensional analyses of a parallel piezoelectric bimorph and triple layer piezoelectric actuators were also done. Normally, as the power generated from piezoelectric materials is too small to be used in practical applications, it is necessary to store the energy by using energy storage devices. Thus, a bridge rectifier and a capacitor to store the energy generated from a piezoelectric generator was used, whilst the efficiency of the generator was evaluated. A piece of lead zirconium titanate (PZT) unimorph and polyvinylidene fluoride (PVDF) stave mounted in a pair of sneakers to generate power during walking, then the energy collected was used to power a RF tag system. The power from a piezoelectric material using a DC-DC converter with an adaptive control algorithm was maximized. With an open circuit voltage of about 95 V, the power stored in the battery can be four times higher than direct charging. Also, experimental investigation for the possibility of harvesting power from a PZT beam (where the energy produced was stored in a 40 mAh nickel metal hydride battery) was performed. Furthermore, investigation for the power harvesting of PZT fibers via strain energy was done and their applications in wireless sensor networks were discussed.

Pulse power generators have been built using explosives to generate shock-waves and depolarize PZT crystals. This device uses a detonator filled with C4 to accelerate an aluminum flyer plate into a PZT disc. The impact of the flyer plate causes the PZT crystal to depolarize, which generates a large voltage pulse. They find a linear relationship between the thickness of the PZT and the generated voltage.

DISCLOSURE OF THE INVENTION

These and other needs are met or exceeded by a method of generating power using a nanoenergetic material. The nanoenergetic material comprising thermite is obtained and deposited on a substrate. An igniter is placed on the nanoenergetic material. When power is desired, the nanoelectric material is ignited. A transducer receives at least one of thermal, light, magnetic, sound and mechanical energy from combustion of the nanoenergetic material and converts it into electrical energy. Preferably, the transducer is a thermoelectric, piezoelectric or magnetoelectric device.

Power is generated with this device is preferably used in pulsed power and continuous power application for portable device. The total power generation can be controlled by the device design and by the controlled ignition of the nanoengineered material. This allows for precise power control by the device.

The self-propagating reaction of the thermites allows power generation to proceed in a controlled manner. The combustion wave of the nanoenergetic material is realized in very small particles, but placement of the particles adjacent to one another allows the combustion of one particle to ignite an adjacent particle. By igniting the nanoenergetic material at one place, the chemical enthalpy over a large area is converted to thermal energy due to rapid self-propagation of the combustion wave.

The integrated system has a unique shockwave generator designed by our novel fabrication technique capable of producing shockwaves at a pressure below the detonation pressure of usual explosives. This system is unique because it generates the shock-wave effect in PZT with a system more compact system which uses 1/1000 of the mass of energetic material.

BEST MODE FOR CARRYING OUT THE INVENTION

Power is generated by the controlled combustion of a nanoenergetic material. In nanoenergetic materials, solid fuel and oxidizer are ground into fine micron-sized particles and combined. In these systems, reactions depend strongly on the interfacial surface area between the fuel and the oxidizer which is affected by the size, impurity level and packing density of the constituent powders. Since the particle size predominates in determining particle surface area, use of smaller particles is desirable to increase the burn rate of the SHS and metastable intermolecular composites ("MIC") material. Self-propagating high temperature synthesis ("SHS") compounds are rapidly combusting systems that include thermites. MIC materials are comprised of a mixture of oxidizer and fuel with particle sizes in the nanometer range.

Nanoenergetic materials, generally 12, are obtained that include thermite. Some embodiments of the nanoenergetic material includes a nanostructure of oxidizer material 20 self-assembled with a fuel 22 in the shape of nanoparticles. Other embodiments of the nanoenergetic composition include physical mixtures of nanoparticles. The nanoenergetic material is a thermite composition, utilizing a metal fuel 22 and an oxidizer 20. Other preferred nanoenergetic particles include metastable intermolecular composites and SHS composites. The efficacy of the nanoenergetic material increases as the purity of the components increases, so the preferred oxidizer and fuel are both relatively high purity. In the discussion that follows, the fuel nanoparticle is described as being shaped into a nanosphere 22 and the oxidizer 20 is shaped into a nanostructure, such as a nanorod 14, nanowire or nanowell 24. These are preferred forms of the nanoenergetic material, but are not intended to be limiting in any way. Use of the fuel as a nanorod or nanowell and spherical oxidizer particle is also contemplated. The fuel and the oxidizer are suitably formed into any shapes that are complimentary to each other, and that increase the interfacial surface area compared to a random particle distribution.

Figure 1:
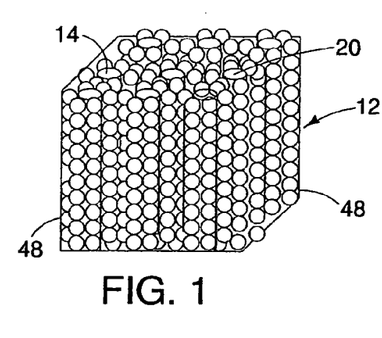
FIG. 1 is a schematic drawing of a self-assembled nanoenergetic material including nanorods.

A wide variety of fuels 22 are useful in this invention. Where the nanoenergetic material is a thermite, the preferred fuel is a metal. Preferred metals include aluminum, boron, beryllium, hafnium, lanthanum, lithium, magnesium, neodymium, tantalum, thorium, titanium, yttrium and zirconium. The use of two or more metals, either physically mixed or alloyed, is also contemplated. Referring to FIG. 1, the fuel is formed into a shape, such as a nanosphere, that provides a homogeneous dispersion and a high surface area compared to the fuel micron sized particles. Sonication is the preferred method for dispersing or shaping the fuel particles. The fuel is placed in a solvent such as 2-propanol and positioned within the sonic field. When activated, the sound waves disperse the fuel, creating extremely small particles that are often substantially monoparticles, comprising few single atoms or molecules of fuel. The high degree of dispersion creates an extremely high fuel surface area. Other shapes, or larger particles, are useful in applications where the extremely fast burn rate is not required.

The oxidizer 20 should be selected to have a high exothermic heat of reaction with the chosen fuel. The fuel and the oxidizer are chosen to assure that a self-propagating reaction takes place. As long as the fuel has a higher free energy for oxide formation than the oxidizer, an exothermic replacement reaction will spontaneously occur. Preferred oxidizers include copper oxide ($CuO$ or $Cu_2O$), silver oxide ($AgO$ or $Ag_2O$), boron oxide ($B_2O_3$) bismuth oxide ($Bi_2O_3$), Cobalt oxide ($CoO$), chromium oxide ($CrO_3$), iron oxide ($Fe_2O_3$) mercuric oxide ($HgO$), iodine oxide ($I_2O_5$), manganese oxide ($MnO_2$), molybdenum oxide ($MoO_3$), niobium oxide ($Nb_2O_5$), nickel oxide ($NiO$ or $Ni_2O_3$), lead oxide ($PbO$ or $PbO_2$), palladium oxide ($PdO$), silicone oxide ($SiO_2$), tin oxide ($SnO$ or $SnO_2$), tantalum oxide ($Ta_2O_5$), titanium dioxide ($TiO_2$), uranium oxide ($U_3O_8$), vanadium oxide ($V_2O_5$) and tungsten oxide ($WO_3$).

Optimally, the amounts of fuel and oxidizer present in the thermite are in a stoichiometric ratio for combustion of the fuel with the oxidizer. Preferred equivalence ratio, $$\Phi = \frac{(F/A)_{actual}}{(F/A)_{stoichiometric}}$$

should be between 1.4 to 1.8.

Preferably, the oxidizer 20 is shaped into a nanorod 14, nanowire or a nanowell 24. The nanorods 14 are preferably synthesized inside and take the shape of the micelles 32 of a polymeric surfactant 34. Nanowires are long, thin nanorods 14. Diblock copolymers are known as surfactants 34 having micelles 32. Polyethylene glycol, such as PEG 400 is preferred for this task. PEG 400 produces nanorods of substantially uniform size. As the molecular weight of the polyethylene glycol increases, the diameter of the nanorod changes, which leads to the nanowire-type structure. For example, PEG 200 produces nanospheres, PEG 400 produces nanorods, and PEG 2000 produces nanowires. The surfactant is selected by the size of its micelles to produce nanorods or nanowires of a particular diameter. Addition of water to the surfactant yields a mixture of nanorods of varying length and having a longer average length.

In a preferred embodiment, copper chloride dihydrate and sodium hydroxide are combined to produce copper oxide within the micelles of PEG 400. Other suitable precursors include copper nitrate, copper carbonate, copper acetate, copper sulfate, copper hydroxide, and copper alkoxide. The ratio of copper chloride dihydrate to sodium hydroxide is from about 1.66 to about 2.1. The copper chloride dihydrate, sodium hydroxide and PEG 400 are pulverized with a mortar and pestle for 30 minutes. Preferred grinding times are from about 10 to about 45 minutes. Other methods of combining these ingredients include stirring, mixing, milling, and attrition. The copper chloride dihydrate and sodium hydroxide react to form copper oxide in the PEG based template. Upon washing with one or more solvents, such as water and ethanol, the polyethylene glycol is removed, yielding free-standing copper hydroxide and oxide nanorods. Calcination at a suitable temperature produces the finished nanorods made up of the copper oxide oxidizer. For copper oxide, calcinations at 450° C. for 4 hours is sufficient.

When the nanoenergetic material is self assembled, at least one of the oxidizer and the fuel is coated with a molecular linking substance 40 that attracts the particles to each other. Preferably the molecular linker is a polymer having two different binding sites, each of which chemically or physically bonds with either the fuel or the oxidizer. Preferably, the binding sites are not random, but are spaced to closely fit the nanospheres against the nanorods for good interfacial surface area.

The presence of material other than fuel and oxidizer tends to slow the burn rate of the nanoenergetic material. Cross-linking or bonding of the molecular linker 40 with itself makes it difficult or impossible to remove excess polymer, thus reducing the burn rate. Thus, another preferred feature of the molecular linker is that it does not bond with itself, allowing excess polymer to be removed until essentially a monolayer of molecular linker remains. Excess molecular linker is preferably removed by sonication of the particles in a solvent that solubilizes non-bonded linker after its application.

Suitable molecular linker polymers 40 include polyvinyl pyrrolidone, poly(4-vinyl pyridine), poly(2-vinyl pyridine), poly(ethylene imine), carboxylated poly(ethylene imine), cationic poly(ethylene glycol) grafted copolymers, polyamide, polyether block amide, poly(acrylic acid), cross-linked polystyrene, poly(vinyl alcohol), poly(n-isopropylacrylamide), copolymer of n-acryloxysuccinimide, poly(acrylonitrile), fluorinated polyacrylate, poly(acrylamide), polystyrene-poly(4-vinyl)pyridine, polyisoprene-poly(4-vinyl) pyridine and combinations thereof. The use of the molecular linker with binding sites is a good method for self-assembly, because each polymer molecule has numerous binding sites. Therefore, when a molecular linker is adsorbed on a surface of a nanoparticle, it has many more sites for binding other nanoparticles. Poly(4-vinyl pyridine) and its analogues are attractive to create self-assembled structures. The pyridyl group in its neutral form has a lone pair of electrons which can be donated to form covalent bonds with metals, undergo hydrogen bonding with the polar species and interact with charged surfaces. The various ways in which molecular linker polymer can interact with surfaces makes it universal binding agent for nanostructural assemblies. The use of this polymer is not yet demonstrated to create self-assembled ordered structure of energetic material.

Metal nanoparticles, such as aluminum nanoparticles, are sonicated in alcohol for a time sufficient to achieve homogenous dispersion. The preferred alcohol is 2-propanol, however, the use of other solvents that allow dispersion of the fuel. The weight to volume ratio of fuel to solvent of about 0.0875 g to 0.75 ml is preferred, though other ratios are useful for other applications.

Sonication is conducted using sound waves 30 of any type of sonication equipment 28. Preferably, for synthesis purposes a sonic bath (Cole Parmer Model 8839) is used. The output sound frequency used is in the range of about 50-60 Hz. Duration of the sonication treatment is any time sufficient to remove all of the molecular linker except the layer that is bonded to the fuel or the oxidizer. Preferably, it is at least 3 hours, and is preferably from about 3 hours to about 16 hours. Sonication is preferred to disperse the particles in a solvent and also for the rapid removal of the excess molecular linker. After sonication, centrifugation is preferred to separate the particles from the solvent containing residual molecular linker.

The steps of sonication followed by centrifugation may be repeated several times to remove excess molecular linker polymer from the fuel or oxidizer particles. The process is repeated as many times as needed. Polymer coated fuel particles result that have a very thin coating of polymer. Preferably the coating is so thin as to form essentially a polymer monolayer. As a result of this process, the resulting coated fuel particles are preferably from about 50 to about 120 nanometers in diameter. Particle diameters of about 50 to about 80 nanometers are more preferred. Reduction of coated fuel particle diameter below about 18 nanometers results in a particle that has a ratio of fuel to polymer that is too low to burn efficiently.

Self-assembly of the oxidizer nanorods and the coated fuel particles preferably takes place by sonication. Oxidizer nanorods are added to a solvent for several hours. The preferred solvent is 2-propanol, but other solvents for sonication as listed above are also useful. Duration for the sonication treatment is preferably from about 3 hours to about 4 hours. The well-dispersed coated fuel particles were then added to the dispersion of the oxidizer nanorods. An additional sonication step was carried out from about 3 hours to about 4 hours. While in the sonicator, the oxidizer and the fuel are thoroughly dispersed. To disperse the fuel and oxidizer, a sonic wand with an output frequency of about 55 kHz is used. The time for sonication is about 9 minutes, but longer sonication times are used depending on the specific application. During the dispersion, the fuel particles coated with the molecular linker are likely to encounter and bind with an oxidizer nanorod. Since the molecular linker has bonding sites specific for the oxidizer, the oxidizer nanorods will bind to the linker on the coated fuel particle, holding them in a position to generate a product containing oxidizer and fuel placed in a close arrangement. The final solution is then dried to obtain the complete nanoparticle composite.

Oxidizer nanowires can also be synthesized and used to make nanoparticle composite. The nanowires were preferably formed by precipitation of the oxidizer from a precipitate of two or more oxidizer precursors 36 from a solution that includes the surfactant. In one embodiment, copper oxide nanowires were synthesized using surfactant templating method. Preferably, polyethylene glycol was mixed with water (2.5:1.5) under continuous stirring to make an emulsion. About 0.5 g of copper chloride dihydrate was dissolved in that emulsion. Another emulsion was prepared using same ratio of PEG and water and then 0.5 g of NaOH was added into it under continuous stirring. The emulsion with copper chloride oxidizer precursor is then mixed with the emulsion with NaOH reactant and stirred slowly for several minutes. In the final solution, an excess amount of ethanol was added to form a gray precipitate. The gray precipitate was then sonicated for 3 hours then centrifuged at 3000 rpm for 10 minutes to collect precipitates. This cycle was repeated at least three times to remove the excess surfactant. The sample is then dried in air at 60° C. for four hours. The dried powder is then calcined at 450° C. for 4 hours to get crystalline copper oxide nanowires.

Figure 4:
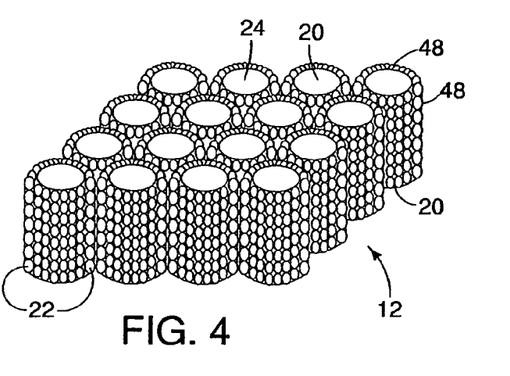
FIG. 4 is a schematic drawing of a self-assembled nanoenergetic material including nanowells.

Turning to FIG. 4, as another alternative to making nanorods or nanowires, the oxidizer can be formed into nanowells 24 using the technique of templating assisted nucleation. Nanowells are shaped have holes or openings in the oxidizer structures into which the fuel particles are placed. In this technique, the nanowells are formed around the exterior of the micelles of the polymeric surfactant. Growth of mesopores is controlled on a length of 1-1.5 microns leading to nanowell structures. This process can be used for any metal, metal oxide and metal ligands. The size and shape of the nanowells depends on the characteristic shape of the micelles in the specific surfactant selected. As with nanorods, the surfactant is removed from the nanowell prior to forming the nanoenergetic material.

Pluronic 123 (BASF, Mt. Olive, N.J.) is a preferred block co-polymer surfactant for making nanowells. Preferably, the surfactant is added to a solvent, such as ethylene glycol methyl ether (methoxyethanol), however, other solvents such as ethanol, ethoxyethanol, methoxyethanol acetate can also be used. The concentration of the surfactant is in the range of 1-60 wt % based on metal alkoxide. Higher concentrations are generally limited by the solubility, which can be improved if a mild heating (up to about 40° C.) with stirring is provided. To this block polymer solution, copper ethoxide, in amounts of about 2-10% g/100 ml is added. Following this, a mild acid, such as 0.01-25 M acetic acid is added to generate a copper complex. This complex undergoes olation in the presence of water and hydrochloric acid.

The fuel is preferably input to the nanowells by means of impregnation. Fuel particles coated with a monolayer of the molecular linker 48 are prepared as described above. The sonicated and centrifuged particles are then dispersed in methoxyethanol and the second reaction component to form the oxidizer. Fuel particles are held within the nanowells by the monolayer of molecular linker present on the surface of the fuel.

Acetic acid and water were added to achieve the nanowell gel structure. Following impregnation with the fuel, the gel was heat processed to drive off organic impurities and templating agents. Preferably, the heat treatment occurs at temperatures of about 200° C. to about 800° C. The duration of the heat treatment should be sufficient to drive off the unwanted components at the temperature selected. Pressure reduction also aids in driving off volatile components. During preparation of copper oxide oxidizer, the gels were heat treated for 24 hours at 200° C. under a vacuum. Dried gels were sonicated in n-hexane in presence of a surfactant and sonicated for few hours. After this, the gels were washed with ethanol and dried at 200° C. for 2 h to obtain free flowing porous gel particles.

In addition to oxidizer and fuel nanoparticles, explosive nanoparticles are optionally added to some embodiments of the nanoenergetic materials. These explosive nanoparticles can be added to any of the above nanoenergetic composites to improve the performance in terms of higher pressures and detonation. In synthesizing explosive nanoparticles, a process is used similar to that described above with respect to formation of the fuel nanoparticles. An explosive material, such as ammonium nitrate, is formed into nanoparticles by dispersion in one or more solvents, then sonicated to obtain a homogeneous material. The solvents are removed by centrifugation and heating.

Stabilization of explosive nanoparticles is performed by forming a core-shell structure with metal oxides. For example, a coating of copper oxide is formed on the ammonium nitrate nanoparticles. The process is suitable to produce the core-shell structure with several other metal oxides.

We have observed that the burn rate for $Fe_2O_3/Al$ combination is significantly less compared to CuO/Al. The addition of nano-ammonium nitrate to the iron oxide thermite increases the pressure and burn rate velocity due to gas generation. With the choice of a nanocomposite of CuO/Al and nano-ammonium nitrate, the properties of the combined material can be tuned to achieve a green primer. However, the nanoenergetic material has the properties of a propellant by replacing CuO by $Fe_2O_3$.

Burn rates exceeding the speed of sound are attainable using the nanoenergetic materials. Table 1 shows the burn rates of copper oxide and aluminum, where the materials differ only in configuration and copper oxide and aluminum added with polymer and explosive nanoparticles. As shown in this table, the copper oxide nanorods self-assembled with aluminum nanoparticles and the copper oxide nanowells impregnated with aluminum nanoparticles have the highest burn rates.

TABLE I

| Serial number | Composite | Burn rate, m/s |
|---|---|---|
| 1 | Copper oxide (CuO) nanowells impregnated with Aluminum (Al)-nanoparticles | 2100-2400 |
| 2 | CuO nanorods mixed with Al-nanoparticles | 1500-1800 |
| 3 | CuO nanorods self-assembled with Al-nanoparticles | 1800-2200 |
| 4 | CuO nanorods mixed with 10% ammonium nitrate and Al-nanoparticles | 1900-2100 |
| 5 | CuO nanowire mixed with Al-nanoparticles | 1900 |
| 6 | CuO nanoparticles mixed with Al-nanoparticles | 550-780 |
| 7 | CuO nanorods mixed with Al-nanoparticles and 0.1% poly(4-vinyl pyridine) | 1800-1900 |
| 8 | CuO nanorods mixed with Al-nanoparticles and 0.5% poly(4-vinyl pyridine) | 1400-1500 |
| 9 | CuO nanorods mixed with Al-nanoparticles and 2% poly(4-vinyl pyridine) | 900-1200 |
| 10 | CuO nanorods mixed with Al-nanoparticles and 5% poly(4-vinyl pyridine) | 400-600 |

The nanoenergetic material is loaded onto the power generator, generally 52, where it is in contact with the igniter. In some embodiments, the nanoenergetic material is packed into wells or other openings on the substrate 56 or an optional second substrate 51. Preferably, the nanoenergetic material is bonded or spin coated onto the substrate. Optionally, the molecular linker is used to bond the nanoenergetic material to the substrate.

An igniter 50 is placed in contact with the nanoenergetic material 12. The igniter is positioned to ignite the nanoenergetic material. It is positioned any location where it will initiate, including between the nanoenergetic material and the substrate, opposite the substrate on or near the nanoenergetic material or even a distance away along a line of sight. Any type of igniter may be used, preferably a platinum heater patterned directly on the substrate. Other preferred igniters include a laser, particularly a pulsed laser, mechanical impact and friction.

When a platinum heater igniter is used, a pattern for the heater mounting is laid down on the substrate 58 using well-known masking techniques. In selecting the placement of the electrode pattern, consideration must be made to ensure an intimate contact between the heating element and the nanoenergetic material. If the chip is being designed as a test apparatus for burn rates, there must be sufficient space on the chip to make a path of nanoenergetic material sufficient in length to obtain an accurate measurement of the time for the flame to travel the length of the test path.

Figure 6:
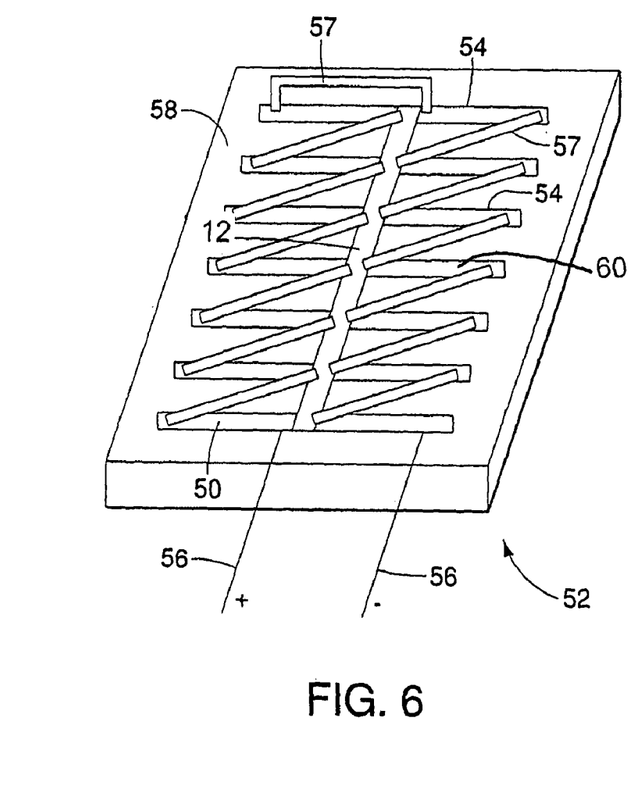
FIG. 6 is a perspective view of a power generator having multiple thermoelectric transducers.
Figure 7:
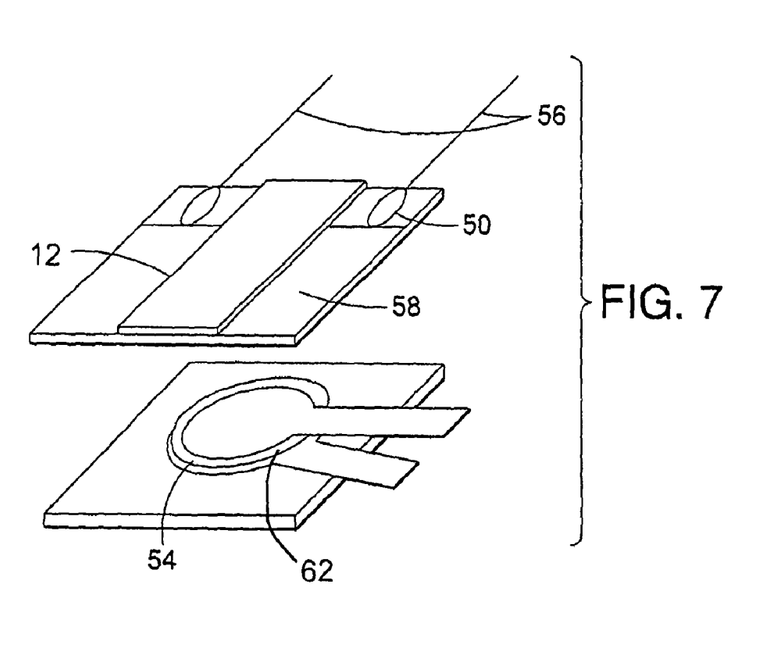
FIG. 7 is an exploded view of a power generator including a piezoelectric transducer.

Optionally, as in FIG. 6, one or more detectors 54 are laid down at the same time as the heater in those embodiments where it is advantageous to detect passage of the moving flame front at one or more points on the chip. Preferably, the detector is a time-varying resistance detector. The pattern for the detector is suitably part of the pattern for the heater. Addition of the detector is useful in applications where the chip is used to test the flame propagation rate or in any situation where it is desirable to know when the flame passes a certain location on the chip.

In at least one embodiment, the heater and optional detector pattern are transferred by any known method, preferably using a lithography process. Lithography, in the context of building integrated circuits such as DRAMs and microprocessors, is a highly specialized process used to put detailed patterns onto substrates. An image containing the desired pattern, such as a mask, is projected onto the substrate, which is coated by a thin layer of a photosensitive resist. When using a positive resist, the bright parts of the image pattern allow chemical reactions which cause the resist material to become soluble. This allows the bright parts of the pattern to dissolve away in a developer liquid, whereas the dark portions of the image remain insoluble. A negative resist allows the dark portions of the image to dissolve and the bright portion of the pattern to become insoluble.

More specifically, the photoresist is coated onto the clean substrate. Any photoresist, either a positive resist or a negative resist is useful. Preferred photoresists include S1813 (Shipley Company, Marlborough, Mass.), and SU8 photoepoxy resist (Microchem Inc., Woburn, Mass.). Preferably, the photoresist is spin-coated by dispensing the solution over the substrate surface and rapidly spinning the substrate until the excess resist is removed and the substrate is dry. Most spin-coating processes are conducted at final spin speeds of 3000-7000 rpm for a duration of 20-30 seconds. Following spin-drying, the substrate is optionally oven dried at 110° C. for about 7-8 minutes. After drying, the mask is placed over the photoresist and it is exposed to light. The brightness of the light source and the duration of the exposure are determined by the specific photoresist that is selected.

If the positive resist is used, the mask is preferably a transparency onto which the desired features are printed in black at a resolution of about 3200×3200. The transparency mask is then used to transfer the design for the igniter and the resistance-temperature detector onto the substrate. The igniter is selected on the basis of resistive heating parameter. Preferred igniters include platinum resistance heaters but other metal resistance heaters can also be used. Enough energy must be supplied by the igniter to cause the nanoenergetic material to burn. Another criteria that is considered is the physical size of the igniter, which may vary by application. Some applications require the use of a very small apparatus, which in turn requires the use of an igniter that fits on the substrate and allows space for placement of the remaining components.

Transparent areas on the mask allow passage of the light, exposing the photoresist in those areas to the photoresist to debond from the substrate. The pattern is permanently transferred into the substrate, for example by a chemical etchant that etches everywhere that is not protected by the resist. Etching removes portions of the substrate, leaving wells or depressions in the substrate. The de-bonding photoresist is wet-etched from the substrate with a developer solution. An aqueous tetramethylammonium hydroxide solution, such as Microposit developer MF-321 (Rohm and Hass, Mass.) is the preferred developer. Other methods of permanently transferring the pattern include metal film etching and shadow masking.

After development, the resist forms the stenciled pattern across the wafer surface which accurately matches the desired pattern. The substrate is thoroughly washed with distilled water to remove resist and developer residues from the pattern. Following washing, the patterned substrate is dried in an appropriate manner.

The patterned substrate is next coated with a conductor to form the heater mounting. Sputter coating is a preferred method of coating the substrate. This technique is well known for increasing the electrical conductivity of a sample, such as samples to be used in a scanning electron microscope. Platinum is the preferred conductor and is preferably sputter coated onto the substrate. The thickness of the conductor film is preferably from about 100 nm to about 200 nm.

In preferred embodiments, the substrate an adhesive metal is coated onto the substrate prior to coating with the conductor for improved adhesion of the platinum film. Preferably, the adhesive metal is titanium that is sputter coated onto the substrate. For the preferred glass substrate, a nm titanium film is sufficient to securely hold a platinum conductor in place.

After coating of the conductor, the photoresist is lifted from the uncovered substrate surface by ultrasonication in acetone in a sonicator. The preferred sonicator is a Cole-Parmer Model 8839 sonicator (Cole-Parmer Instrument Company, Vernon Hills, Ill.). When the preferred Cole-Parmer sonicator is used, the output sound frequency was in the range of 50-60 Hz. Sonication should continue until the pattern is etched into the substrate, preferably from about 5 min to about 10 min. The substrate is washed and dried in any suitable manner after sonication.

The nanoenergetic material is deposited on a substrate 58 to make a chip. The chip has an on-board igniter or heater to ignite a nanoenergetic material on a substrate. A preferred method for fabricating the chip is described herein. A variety of substances are useful as the substrate. The substrate should be inert to the nanoenergetic material and be able to withstand the heat generated by the flame front. Glass is a particularly preferred substrate. Other preferred substrates include silicon, perforated glass, LEXAN® brand polycarbonate and plastics. The term "substrate" is not intended to be limited to a single supporting object, even though the singular form of the term is used. One or more physical materials can form the substrate.

Prior to installation of any of the chip components, the substrate should be cleaned to remove impurities that may affect the preparation of the apparatus or the properties of the nanoenergetic material. When glass is used as the substrate material, it is preferably cleaned with a corrosive acid solution such as Aqua Regia (a combination of concentrated sulfuric acid and concentrated nitric acid) or Piranha solution (a combination of concentrated sulfuric acid and hydrogen peroxide) to remove metals and organic contaminants. Residual acids or sulfates are preferably removed by rinsing the substrate under running distilled water. Cleaned substrates are preferably dried at suitable temperatures and pressures. Glass is suitably dried above 100° C., preferably at about 105° C. for about 15 minutes.

The molecular linker is optionally coated onto the substrate to bind the nanoenergetic material to the substrate surface. The linker is able to bond with both a fuel and an oxidizer nanoparticles. Preferably, the binding sites are not random, but are spaced to non-randomly intermix the fuel and oxidizer for good interfacial surface area. The molecular linker selected may be the same as or different than the molecular linker used to assemble the nanoenergetic material.

A polymer having a "pyridyl" group is a preferred molecular linker, and poly (4-vinyl pyridine), available from Aldrich Chemical, (Sigma-Aldrich Co., St. Louis, Mo.). A solution is prepared having a concentration of about 0.001-0.1% of the molecular linker in 2-propanol and is coated onto the substrate. Any suitable coating method is usable to coat the molecular linker solution, but spin-coating and dip-coating are preferred.

After the molecular linker is optionally coated onto the substrate, it is preferably washed in ethanol, and then annealed. If used, annealing takes place at temperatures of about 110° C. to about 160° C. for several hours. When the preferred poly (4-vinyl pyridine) molecular linker is used, annealing takes place at about 120° C. for about 4 hours. In embodiments where the nanoenergetic material covers the entire substrate, it is deposited directly onto the molecular linker.

In embodiments where the nanoenergetic material does not cover the entire substrate, a second mask, including a pattern for the nanoenergetic material, is prepared and transferred to the substrate using a lithography process as discussed above. The size and shape of the pattern depends upon the end use to which the chip is to be put. If, as in at least one preferred embodiment, the power generator chip includes a plurality of transducers, it is advantageous to deposit the nanoenergetic material along a path to direct it to positions where the energy is absorbable by the transducers. For example, where multiple platinum/aluminum thermocouple strips are used, the path traveled by the flame front preferable intersects the transducers multiple times. Such paths generally have a large number of turns and switchbacks to efficiently use the amount of space available on the substrate.

The molecular linker-coated substrate is next coated with a photoresist using transparency masks to create any of a variety of patterns using any lithographic technique, such as that described above. Hard masks can also be used in place of transparency mask. Shipley S1813 photoresist is a preferred photoresist for this step. Ultrasonication is the preferred method for lifting the photoresist from the remaining substrate surface. The patterned substrate 66 is then preferably rinsed in distilled water and suitably dried.

A mixture of the fuel and the oxidizer is spun coated onto the molecular-linker pattern. Preferably, the mixture is prepared by sonication of the metal nanoparticles and the oxidizer nanoparticles together for about 8-10 hours, or until a homogeneous dispersion of nanoparticles is achieved. The mixture was spun onto the substrate at about 1000 rpm to about 3000 rpm for about 30 to about 120 seconds, after which the substrate was dried. Excess nanoenergetic particles are removed by agitation in acetone, followed by sonication of the patterned substrate.

When it is desirable to release the energy of the supported nanoenergetic material, the nanoenergetic material is ignited by the igniter. If the preferred platinum heater is used, electricity is applied to the strip via leads 56. Where a laser igniter is used, it can be fired at the nanoenergetic material along a line of sight to heat it and begin combustion. Following ignition, the combustion reaction of the nanoenergetic material is self-sustaining and will continue until all of the nanoenergetic material has reacted.

Energy from the combustion of the nanoenergetic material is received and harnessed by at least one transducer 54. Thermal energy in the form of both heat and radiation, light, sound and mechanical energy from a shock wave are produced during the reaction. Any one or combination of transducers that receives these energy types and converts the energy into electrical energy is useful. The combination of transducers can be positioned on a single substrate or on multiple substrates. Depending on the nature of the transducer, it may generate an electrical charge either continuously or in discrete pulses.

Thermoelectric transducers 60 convert heat into electricity. The thermoelectric transducer can be fabricated by making two junctions with Al wire with the platinum strip. This transducer will generate power when one junction is heated while other junction is kept at room temperature. Other thermoelectric transducers include CHROMEL®/ALUMEL® and Pt/Pd thermocouples. In a preferred embodiment, a mask is used to deposit the platinum and Al thermoelectric material in a pattern that each Al strip intersects adjacent platinum strips. This way a series of Pt/Al junctions are achieved. Each time the Pt/Al is heated by the passage of the combustion flame front, an electrical charge is generated. Use of multiple Pt/Al strips on a single substrate, each of which is intersected by the nanoenergetic material multiple times, generates the type of electrical signal that is very useful.

Thermoelectric power generator can be made of semiconductor also. Whenever there is a temperature difference between the two points of the open circuit that is made up of two heterogeneous semiconductors, thermal electromotive force is produced, which is in direct proportion to the temperature gradient between the two points.

Magnetohydrodynamic generators transform thermal energy or kinetic energy directly into electricity. An example implementation would consist of a pipe or tube of some non-conductive material. When an electrically conductive fluid flows through the tube, in the presence of a significant perpendicular magnetic field, a charge is induced in the field, which can be drawn off as electrical power by placing the electrodes on the sides at 90 degree angles to the magnetic field. There are some limitations that must be met on the density and type of field used. The amount of power that can be extracted in this manner is proportional to the cross sectional area of the tube and the speed at which the conductive substance flows. The heating of a gas to plasma or the addition of other easily ionizable substances like the salts of alkali metals accomplishes this increase in conductivity. Generated power can be varied by the generator design. The efficiency of the magnetohydrodynamic generator in a single stage is estimated to be no greater than 10 to 20 percent.

Piezoelectric materials 62 are one of the best ways of converting mechanical energy or shock waves into an electrical impulse, and is another type of preferred transducer. Examples of suitable piezoelectric materials include quartz, barium titanate, lead zirconate titanate ("PZT"), polyvinylidene fluoride, zinc oxide. When these materials are compressed, a voltage difference develops across two of its faces. The piezoelectric material is positioned to receive the shock wave after ignition of the nanoenergetic material.

Any other transducers, including those that convert light, sound and other forms of energy are also useful.

In preferred embodiments, the transducers are positioned on the microchip or on the array. However, it is contemplated that one or more transducers be positioned other than on the microchip. Placement of an object between the power generator and the transducer allows an image to be made of the object. Such embodiments are useful for medical and other imaging techniques.

Simultaneous use of multiple transducers on a microchip or with an array of chips is also contemplated. Combustion gives off energy in the forms of heat, light, sound, radiation and shock wave. Use of transducers that convert two or more of these energy forms increases the efficiency of the conversion process.

The nanoenergetic material is optionally optimized to generate shock wave over heat by the change is shape and position of the material. When the nanoenergetic material is shaped as a nanowell and/or confined in a pore of the substrate, more of the energy goes into the shock wave. Nanorods and/or a configuration where the nanoenergetic material is spread out in a relatively flat surface favors heat production. When fuel and nanorods are self-assembled, the material generates shock waves. Thermites with slow burn rates such as iron oxide produce heat, and not shock waves. Nanoenergetic materials modified by nanoparticles of explosives such as ammonium nitrate increases the intensity of shock wave further.

The amount of energy that is obtainable from the on-chip nanoenergetic material is increased by using an array of several nanoenergetic devices. When arrays are designed, they can be present on individual substrates. Another preferred option is to use the appropriate masks to deposit multiple igniters and fields of nanoenergetic material on a single substrate. When such arrays are used, any appropriate number of igniters or transducers can be used. In some embodiments arrays are formed by repeating the process steps to form multiple chip units on a single substrate.

Arrays of power generators are useful to generate either continuous or pulsed power, depending on the number and the sequence by which the power generators are ignited. Power that is substantially continuous is obtained by igniting the power generators in series, with each power generator in sequence being ignited a very short time after ignition of the previous power generator. The exact time selected is determined by the power requirements of the power user. Times of about 30 to about 60 milliseconds produce substantially continuous power in some embodiments.

EXAMPLE 1

Figure 2:
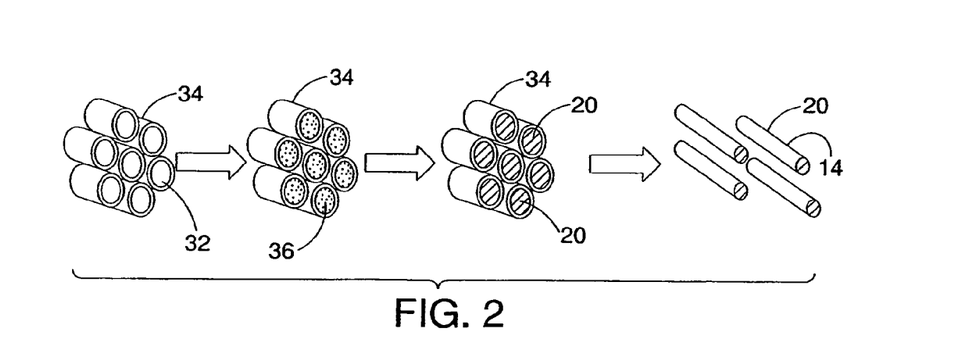
FIG. 2 is a schematic drawing showing the steps for making a nanorod.
Figure 5:
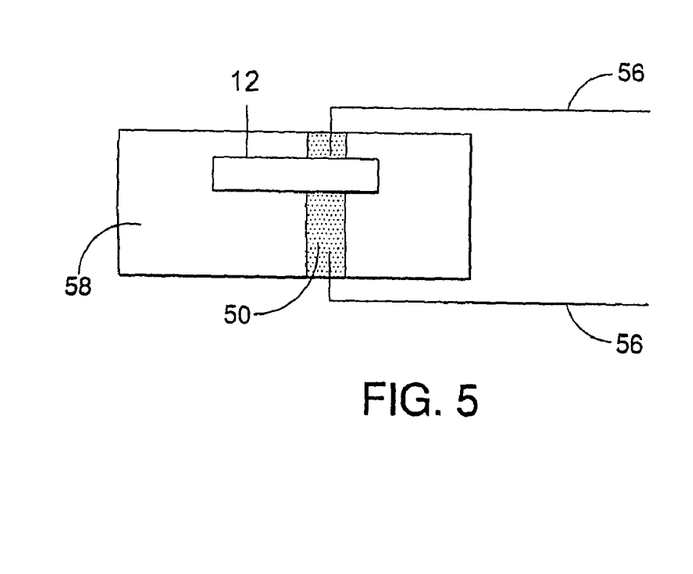
FIG. 5 is a top view of a power generator of the present invention.

A device shown in FIG. 5 was fabricated where a clean glass substrate was coated with sputtered platinum film with Al wire connections on both sides for creating junctions and a dispersed thermite comprising nanorods of CuO and aluminum (wt.—10-20 mg) on one Pt/Al junction. An impact initiation was utilized to trigger a thermite reaction. A standard weight of 200 g was dropped from a height of 20 cm over the thermite. Due to a temperature differential between two Pt/Al junctions over the platinum film, voltage was generated, which was recorded using a data acquisition card (DAQ) and LabVIEW program. A voltage pulse of about 0.3 V peak voltage and 126 microsecond width at FWHM was generated using one Pt/Al (platinum film) transducer (FIG. 2). From the generated voltage value, the seebeck coefficient of platinum is calculated to be about 17 $\mu V/°C$. This generated voltage of 0.3V is the open circuit voltage. To calculate the power and conversion efficiency, a load resistor is used in parallel of the platinum film. The value of the resistor is 13 ohm and the peak generated voltage is 0.07 V.

EXAMPLE 2

From our experiment of one platinum strip, the rise time of the open circuit output voltage is 100 $\mu S$ and fall time is 360 $\mu S$. Total response time is 460 US. Taking the speed of the propagation of the energetic reaction of 2300 m/S, the reaction propagates 1380 mm in 460 $\mu S$. Taking the width of one platinum strip 3 mm and the gap between two strips 3 mm, the total number of platinum strips in 1380 mm is 230. In a device similar to the design of FIG. 6, 460 platinum strips are placed within that distance. By the time the generated voltage from first platinum strip goes zero the voltage of $460^{th}$ platinum strip starts to rise. So 460 platinum strips work as a voltage generator connected in series at the same time. Because, all platinum strips do not generate equal voltage at the same time, the peak output voltage will be the sum of all 460 voltage generators and that is 0.3*460/2=69 V. More voltage is generated using thinner platinum strips which allow more strips within the distance of 1380 mm. More voltage can also be generated if used with a thermocouple with high Seebeck coefficient. The time of the peak voltage can be increased with more platinum strips in series. If there are 1840 platinum strips in series then this time will be 460 $\mu S$*4=1840 $\mu S$.

Figure 3:
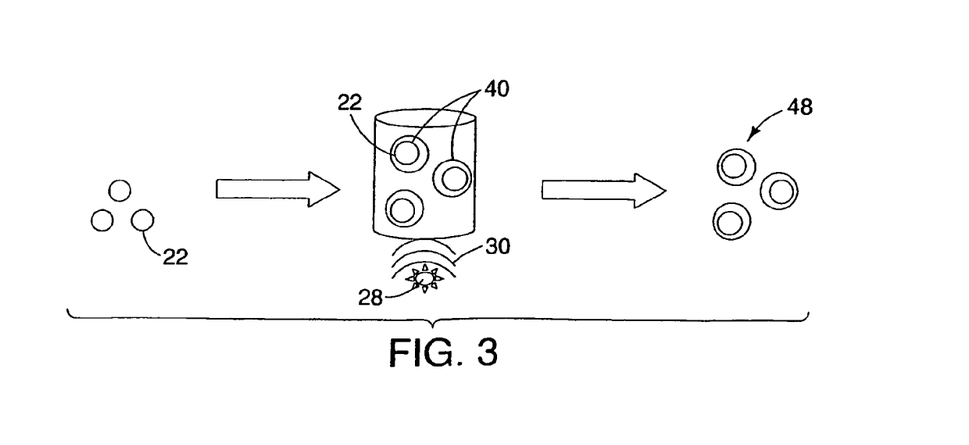
FIG. 3 is a schematic drawing showing the steps for coating nanoparticles with the molecular linker.

An improved design of the thermoelectric power generator is shown in FIG. 3. Pt/Al thermocouples with trace widths of 10 microns and gaps of 10 microns are fabricated using micro-fabrication techniques, a load resistor transient voltage profile such as that shown in FIG. 4 is created. For a 30 mm strip of thermite material with 3000 Pt/Al thermocouples in series, the electric energy supplied to a 13 ohm load resistor is about 8.43 J.

EXAMPLE 3

Figure 8:
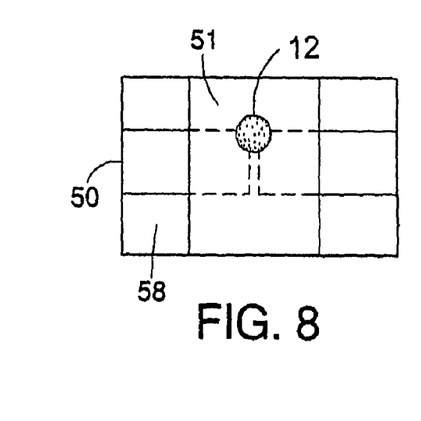
FIG. 8 is a top view of a shock wave generator.

A schematic of the millimeter scale device is shown in FIG. 8. Wells were made by gluing a thick LEXAN® brand polycarbonate substrate containing a pre-drilled through-hole to a glass substrate. The glass substrate had a sputtered thin-film heater composed of platinum on a titanium adhesion layer. The LEXAN® brand polycarbonate substrate is positioned such that the hole in it is aligned over the heating element of the Pt film. Leads are soldered to the metal film to allow connection to the heater. The hole was then packed with MIC powder using a Teflon spatula. The 5-15 mg of MIC material was a composite consisting of CuO nanorods with Al particles assembled on the surface of the nanorods. The diameter of the wells tested varied from 1.6 mm to 2.38 mm. A variation of this device can be made in which a thin elastic membrane can be placed over the opening of the well. In preliminary testing, a 1 mm thick polydimethylsiloxane ("PDMS") membrane was glued on the top of the well after filling the well with MIC material. The elastic membrane reduces the deceleration of the shock wave as it travels down the shock-tube. Devices containing 10-21 mg of MIC material produced shock-waves with MACH number of 2.18-2.5.

EXAMPLE 4

To demonstrate power generation, a piezoelectric disc (APC-855) was placed on a glass substrate. A shock wave generated after initiation of the thermite reaction using an on-chip heater, produced a voltage pulse with 1000V peak, 55 $\mu s$ FWHM, and an energy of 32.5 $\mu J$, recorded using a DAQ card and LabVIEW program.

EXAMPLE 5

The device consisted of a Pt thin-film beater on a $SiO_2$Si substrate and a (500 $\mu m$) 3 well molded in PDMS. A schematic of the device is shown in FIG. 12. First, a silicon substrate having had a 2000 Å $SiO_2$ passivation layer deposited on it by PECVD. Then, Pt heaters were patterned on the top of the $SiO_2$ layer using a photoresist etch-mask and sputtered Pt/Ti bi-layer.

Independently, a 500 μm PDMS membrane was molded to have (500 μm) 2 holes through it. The mold is formed by pressing a LEXAN® brand polycarbonate substrate (General Electric Corp., Worchester, Mass.) against a steel plate that had been machined to create the wells in PDMS. The steel plate contained cubic bumps milled into its surface. Eighteen bumps were created in a 3×6 grid on the 1 in. by 3 in. surface. A side view of the plate pressed against the LEXAN® brand polycarbonate substrate is shown in FIG. 6. After a molding the membrane, the wells were cut out and one well was bonded over each heater. The PDMS membrane was bonded to the $SiO_2$ surface on the silicon substrate using $O_2$ plasma bonding.

The backside of the silicon substrate was then bonded onto a 25×25×3 $mm^3$ LEXAN® brand polycarbonate substrate, using adhesive. Small holes were drilled in the lexan for electrical feedthrough. Leads were soldered to the platinum films and fed through the holes. Then the holes were then filled with epoxy to secure the leads and seal the backside of the device.

The last step in the fabrication was loading the well with MIC powder. The self-assembled material was used in the device. This composite consists of CuO nanorods with Al particles assembled around the nanorods using a polymer binder. A Teflon spatula was used to press MIC powder into the wells. On the macro-scale, both the pressure wave velocity and intensity increase with packing density; therefore the samples were packed as tight as possible with the spatula. The mass that was packed into each well was ~200 μg, but the balance had a resolution of 100 μg; therefore, the measured value is not precise. A picture of the device before and after loading it with the MIC material is show in FIG. 14. These devices produced shock-waves of MACH 1.29.

EXAMPLE 6

The thin metal films for the on-chip heater and burn rate measurement are patterned on a glass substrate. An adhesion layer of titanium is sputtered on glass followed by a platinum layer. The films are patterned using an S1813 photoresist lift-off procedure. The platinum film used to measure the burn rate is 225 μm thick.

A microchannel mould is constructed using SU-8 photoresist on a silicon substrate. The SU-8 photoresist allows for micron level control and resolution of channel features. The elastomeric polymer polydimethylsiloxane PDMS is mixed in a 10:1 ratio and cast and cured on the SU-8 mould at 85° C. for 90-110 minutes. The PDMS channel is separated from the mould. The PDMS and glass slide are permanently bonded on contact after receiving an RF oxygen plasma treatment. Wires are soldered to contact pads that act as voltage probes for on chip burn rate measurement. The device has a PDMS microchannel 15 mm long, 1 mm wide, and 225 μm tall. The beginning of the PDMS microchannel is positioned over the thin metal bridge connecting the two sides of the heater.

EXAMPLE 7

A device that does not have on-chip heater or burn rate measurement is made as above but without sputtering metal thin films. Energetic material is prepared in slurry form and injected into the channels using a microliter syringe. A voltage is applied to the on-chip heater, initiating the material.

The burning rate data was measured. Preliminary results indicate a burn rate of 750 m/s and successful propagation through the entire length of the microchannel. Burn rates of the devices that do not have on-chip capabilities indicate a slower burning rate but present consistent evidence of acceleration. The core of the Fiber optic sensors are placed 7 mm apart. Channels are positioned at position of 0 mm, 7 mm, and 14 mm. The time of arrival from sensor 2 to sensor 3 is less than the time of arrival from sensor 1 to sensor 2 although the sensors are evenly spaced.

EXAMPLE 8

Figure 9:
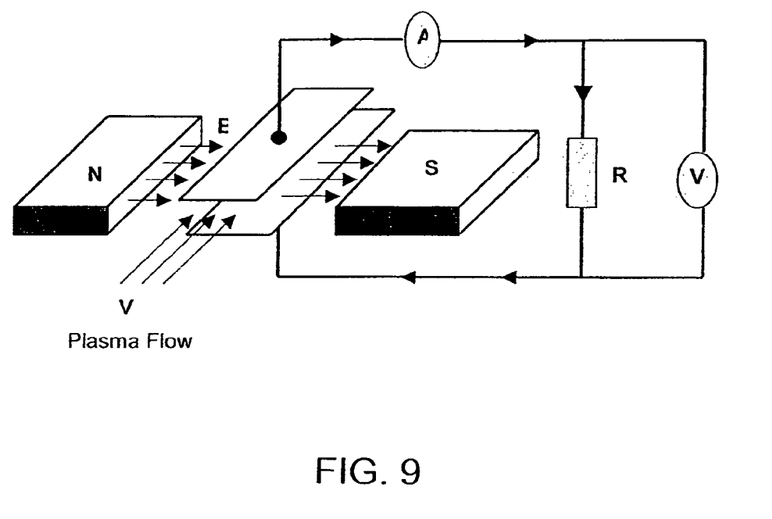
FIG. 9 is a schematic view of a magneto hydrodynamic transducer.

To demonstrate the use of a magneto hydrodynamic transducer, we fabricated a device shown in FIG. 9 in which a magnetohydrodynamic transducer was used. A jet of hot ionized plasma generated after initiation of thermite reaction using an on-chip heater was directed through a magnetic field. It produce a peak voltage of 2-3 V on 20 Ohm load, recorded by digital oscilloscope (Tektronix TDS 3014B; Tektronix, Inc. Beaverton, Oreg.).

While a particular embodiment of the method for on-chip power generation has been shown and described, it will be appreciated by those skilled in the art that changes and modifications may be made thereto without departing from the invention in its broader aspects and as set forth in the following claims.

PDMS is a highly viscous, easily modifiable liquid prior to curing. The composition of PDMS can be altered with dopants or fillers prior to cross-linking, allowing for alterations in the cured materials mechanical strength, electrical conductivity, etc. PDMS can be doped with metallic (Fe, AlO2) and silica mico and nano powders. Metals and porous metals show reduced compression when shock loaded in comparison to other materials. PDMS heavily doped with metal powders is believed to structural reinforce PDMS, reducing energy losses due to channel vibrations caused by the shockwave. Metals can also be used minimize shock wavefront dispersion, by reflecting portions of the dispersed wavefront back into the channel.

While a particular embodiments of the shock wave and power generators using nanoenergetic materials has been shown and described, it will be appreciated by those skilled in the art that changes and modifications may be made thereto without departing from the invention in its broader aspects and as set forth in the following claims.

What is claimed is:

1. A method of generating power comprising:
   igniting nanoenergetic material that is on a substrate, the nanoenergetic material comprising a mixture of oxidizer and fuel nanostructures;
   receiving, with a transducer, energy from a shockwave generated by combustion of the nanoenergetic; and
   using the transducer to convert the energy from the shockwave into electrical energy.

2. The method of claim 1 wherein the nanoenergetic material is in the form of at least one of nanorods and nanowells.

3. The method of claim 1 wherein the igniter is a platinum strip.

4. The method of claim 1 wherein the transducer comprises at least one of the group consisting of thermoelectric device, a piezoelectric device and a magnetoelectric device.

5. The method of claim 1 wherein the nanoenergetic material is confined by wells, channels or pores defined in the substrate to promote shockwave generation.

6. The method of claim 1 the transducer is a piezoelectric material.

7. The method of claim 6 wherein the piezoelectric material is at least one of the group consisting of quartz, barium titanate, lead zirconate titanate ("PZT") and polyvinylidede fluoride.

8. The method of claim 1 wherein transducer is a thermoelectric device.

9. The method of claim 8 wherein the thermoelectric device is a platinum/aluminum thermocouple.

10. The method of claim 1 wherein the transducer is a magnetoelectric device.

11. The method of claim 10 wherein the magnetoelectric device utilizes a flowing fluid comprising plasma.

12. The method of claim 1 wherein the substrate comprises at least one of the group consisting of glass and plastic.

13. The method of claim 12 wherein the plastic is a polycarbonate resin.

14. The method of claim 1 further comprising charging a capacitor with electrical energy.

15. The method of claim 1 further comprising repeating said depositing, placing and igniting steps to form a nanoenergetic array.

16. The method of claim 1 wherein the transducer converts optical energy to electrical energy.

17. A method of generating power comprising:
    obtaining nanoenergetic material on a substrate, the nanoenergetic material being one of thermite, self-propagating high temperature synthesis ("SHS") compounds or metastable intermolecular composites in the form of at least one of nanorods and nanowells;
    positioning an igniter to ignite the nanoenergetic material;
    igniting the nanoenergetic material;
    receiving at least one of the group consisting of thermal and mechanical energy from combustion of the nanoenergetic material by a transducer; and
    using the transducer to convert the at least one of the group consisting of thermal and mechanical energy into electrical energy.

18. A method of generating power comprising:
    obtaining nanoenergetic material on a substrate, the nanoenergetic material being one of thermite, self-propagating high temperature synthesis ("SHS") compounds or metastable intermolecular composites in the form of at least one of nanorods and nanowells;
    positioning an igniter to ignite the nanoenergetic material;
    igniting the nanoenergetic material to create a shockwave;
    receiving the shockwave with a piezoelectric transducer; and
    converting the shockwave into electrical energy into electrical energy with the piezoelectric transducer.

19. A method of generating power comprising:
    obtaining nanoenergetic material on a substrate, the nanoenergetic material being one of thermite, self-propagating high temperature synthesis ("SHS") compounds or metastable intermolecular composites in the form of at least one of nanorods and nanowells;
    positioning an igniter to ignite the nanoenergetic material;
    igniting the nanoenergetic material;
    receiving at least one of the group consisting of thermal and mechanical energy from combustion of the nanoenergetic material by a transducer; and
    using the transducer to convert the at least one of the group consisting of thermal and mechanical energy into electrical energy.

20. The method of claim 1, wherein the nanoenergetic material comprises a molecular linker that does not bond to itself.

* * * * *

UNITED STATES PATENT AND TRADEMARK OFFICE
CERTIFICATE OF CORRECTION

PATENT NO. : 8,066,831 B2
APPLICATION NO. : 12/083985
DATED : November 29, 2011
INVENTOR(S) : Gangopadhyay et al.

It is certified that error appears in the above-identified patent and that said Letters Patent is hereby corrected as shown below:

On the Title Page:
In the "(75) Inventors:" Section:
    Please delete "Yuangang Gao" and insert -- Yuanfang Gao -- therefor.

In the "Other Publications", Item [56]:
On page 2, right column, line 17
    After "Reaction", please delete "Paramters" and insert --Parameters-- therefor.

| | |
|---|---|
| Col. 3, line 6 | After "compact", please delete "system". |
| Col. 4, line 1 | Please delete "increase" and insert --increases-- therefor. |
| Col. 6, line 58 | Please insert --the-- between "using" and "same". |
| Col. 7, line 7 | Please insert --to-- between "shaped" and "have". |
| Col. 9, line 49 | Please insert --the-- before "resistive". |
| Col. 10, line 19 | After "substrate", please insert --is--. |
| Col. 10, line 20 | Before "is coated", please insert --that--. |
| Col. 10, line 65 | Please delete "nanoparticles" and insert --nanoparticle-- therefor. |
| Col. 12, line 12 | Please insert --the-- after "while". |
| Col. 13, line 5 | After "change", please delete "is" and insert --in-- therefor. |
| Col. 13, line 64 | Please delete "US" and insert --$\mu$S-- therefor. |
| Col. 14, line 4 | Before "first platinum", please insert --the--. |
| Col. 15, line 9 | After "After", please delete "a". |
| Col. 15, line 32 | Please delete "show" and insert --shown-- therefor. |
| Col. 16, line 3 | After "positioned at", please delete "position" and insert --positions-- therefor. |
| Col. 16, line 27 | Please delete "materials" and insert --material's-- therefor. |
| Col. 16, line 32 | Please delete "structural" and insert --structurally-- therefor. |
| Col. 16, line 34 | Before "minimize", please insert --to--. |

Signed and Sealed this
Twenty-ninth Day of January, 2013

David J. Kappos
*Director of the United States Patent and Trademark Office*

CERTIFICATE OF CORRECTION (continued)
U.S. Pat. No. 8,066,831 B2

| | |
|---|---|
| Col. 16, line 57<br>Claim 4, line 2 | After "consisting of", please insert --a--. |
| Col. 16, line 62<br>Claim 6, line 1 | After "claim 1", please insert --wherein--. |
| Col. 17, line 1<br>Claim 8, line 1 | After "wherein", please insert --the--. |
| Col. 18, lines 11-12<br>Claim 18, lines 11-12 | Please delete the second occurrence of "into electrical energy". |